(12) United States Patent
Choi

(10) Patent No.: US 6,584,572 B1
(45) Date of Patent: Jun. 24, 2003

(54) DATA INPUT-OUTPUT CIRCUITS THAT SELECTIVELY INVERT BITS

(75) Inventor: Jung-hwan Choi, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/361,862

(22) Filed: Jul. 27, 1999

(30) Foreign Application Priority Data

Aug. 19, 1998 (KR) .............................. 98-33627

(51) Int. Cl.$^7$ .............................. G06F 1/32; G06F 1/30; G06F 3/00
(52) U.S. Cl. ........................... 713/320; 713/300; 710/1
(58) Field of Search ................. 713/320, 300; 710/1, 65

(56) References Cited

U.S. PATENT DOCUMENTS

| | | | |
|---|---|---|---|
| 4,495,626 A | 1/1985 | Brunin et al. .................. 375/19 |
| 4,667,337 A | 5/1987 | Fletcher ........................ 377/41 |
| 5,630,106 A | 5/1997 | Ishibashi ..................... 395/521 |
| 5,874,833 A * | 2/1999 | Perry et al. .................... 326/21 |
| 5,890,005 A * | 3/1999 | Lindholm ..................... 377/41 |
| 5,931,927 A | 8/1999 | Takashima |
| 6,243,779 B1 * | 6/2001 | Devanney et al. ............. 326/21 |

FOREIGN PATENT DOCUMENTS

| JP | 62052708 A * | 3/1987 | ............ G11B/5/09 |
|---|---|---|---|
| JP | 9-251336 | 9/1997 | |

OTHER PUBLICATIONS

IBM, Input Impedance Reduction Through Current Inversion and Negative Bootstrapping, Oct. 1976, IBM Technical Disclosure Bulletin, Issue No. 5, pp. 1738–1739.*
Great Britain Search Report, GB 9918763.5, Oct. 27, 1999.
Examination Report, UK Application No. GB 9918763.5, Jul. 17, 2002.

* cited by examiner

Primary Examiner—Dennis M. Butler
Assistant Examiner—Suresh K Suryawanshi
(74) Attorney, Agent, or Firm—Myers Bigel Sibley & Sajovec

(57) ABSTRACT

A plurality of bits is output if more of the plurality of bits are of a first logical value than a second logical value, and the plurality of bits inverted is output if more of the plurality of bits are of the second logical value than the first logical value. An indicator also is provided as to whether the plurality of bits or the plurality of bits inverted are output. Thus, for example, if more of the bits are of the logical value that causes high current consumption, the output bits are inverted so that the bits can be output with reduced current consumption. Upon receipt, the plurality of bits and the indicator are received. The plurality of bits is retained if the indicator is of a first value and the plurality of bits is inverted if the indicator is of a second value. Thus, the power consumption of the data input-output circuits may be reduced.

6 Claims, 5 Drawing Sheets

DATA INPUT-OUTPUT CIRCUITS THAT SELECTIVELY INVERT BITS

FIELD OF THE INVENTION

The present invention relates to integrated circuit devices and more particularly to data input-output circuits and methods for integrated circuit devices.

BACKGROUND OF THE INVENTION

Integrated circuit devices, such as memory devices, are widely used in commercial and consumer applications. As integrated circuit devices continue to advance, high speed and high integration are generally desired. For such high-speed operation, the integrated circuit device may have an output unit with an open-drain structure.

An output unit with the open-drain structure has an output transistor where the drain port is floating. Either an NMOS or PMOS transistor can be used as the output transistor. When an NMOS transistor is used, the source port is connected to ground voltage (VSS) and the gate port receives real data to be output. In the open drain structure, the drain port of the output transistor is connected to a terminal voltage (Vterm) via a resistor. It will be understood that although an open-drain structure having an NMOS-type output transistor is described herein, PMOS devices also may be used.

Thus, when the real data is "0", the output transistor is turned off. The voltage level of the output signal at the drain port of the output transistor becomes the terminal voltage (Vterm). When the real data is "1", the output transistor is turned on. Thus, the voltage level of the output signal at the drain port of the output transistor is a value obtained by subtracting the voltage drop value across the resistor from the terminal voltage (Vterm). Thus, the output data of the open-drain output unit is defined only as logic "1" which is a state of consuming current, or as logic "0" which is a state of non-consuming current.

The open-drain output unit has a predetermined swing width to produce the data output of "1" or "0". Thus, a predetermined positive current flows through the resistor, so that when the output data is "1", a great amount of current may be consumed.

For example, when the resistance value of the resistor is 20Ω, approximately 50 mA of current flows from the terminal voltage (Vterm) to the ground voltage (VSS) to produce a swing width of about 1V. Thus, when 8 bits of output data having a data value of "1" are output, the open-drain output unit consumes a current of about 400 mA (=50 mA per bit). Unfortunately, such an increase in the amount of consumed current may decrease the efficiency and/or may shorten the life of the integrated circuit device.

SUMMARY OF THE INVENTION

It is therefore an object of the present invention to provide improved data input-output circuits and methods for integrated circuit devices.

It is another object of the present invention to provide data input-output circuits and methods that can reduce power consumption compared to conventional input-output circuits and methods.

These and other objects are provided, according to the present invention by outputting a plurality of bits if more of the plurality of bits are of a first logical value than a second logical value, and outputting the plurality of bits inverted if more of the plurality of bits are of the second logical value than the first logical value. An indicator also preferably is provided as to whether the plurality of bits or the plurality of bits inverted are output. Thus, for example, if more of the bits are of the logical value that causes high current consumption, the output bits are inverted so that the bits can be output with reduced current consumption. Upon receipt, the plurality of bits and the indicator are received. The plurality of bits is retained if the indicator is of a first value and the plurality of bits is inverted if the indicator is of a second value. Thus, the power consumption of the data input-output circuits may be reduced.

According to an aspect of the present invention, there is provided an output circuit for simultaneously outputting a plurality of data values A causing a current consumption of a, or B causing a current consumption of b which is more than the amount a. A plurality of data output units detect a plurality of real data values and generate temporary data corresponding to the respective real data in response to a control signal. A control unit generates the control signal which is activated according to the magnitude relation between the number of real data values A and the number of real data values B. The temporary data is the inverted real data when the number of real data values A is less than the number of real data values B, and the non-inverted real data when the number of real data values A is greater than the number of real data values B.

Preferably, the control unit includes a non-inversion detecting unit that detects the non-inverted data values of the real data and that generates a non-inversion detecting signal driven by the non-inverted data having the data values of B. An inversion detecting unit detects the inverted data values of the real data and generates an inversion detecting signal driven by the inverted data having the data values of A. A comparator compares the voltage level of the non-inversion detecting signal to the voltage level of the inversion detecting signal, and generates the control signal.

According to another aspect of the present invention, there is provided an input-output system for simultaneously inputting and outputting a plurality of real data having data values of A causing a current consumption of a, or B causing a current consumption of b which is more than the amount a. The input-output system includes an output device that detects the data values of the real data and provides transmission data corresponding to the real data, and an indication signal (indicator) to indicate the relationship between the real data and the transmission data. An input device receives the transmission data and the indication signal and provides input data, whose relationship with the transmission data is determined by the indication signal, to an internal circuit. The transmission data is the inverted real data when the number of real data values having the data value of A is less than the number of real data values having the data value of B, and the non-inverted real data when the number of real data values having the data value of A is greater than the number of real data values having the data value of B. The input data has the same data value as the real data.

According to still another aspect of the present invention, there is provided an output device for simultaneously outputting a plurality of data. The output device includes a data storage unit that stores predetermined real data and provides a plurality of real data in an output mode. An output circuit receives the real data and generates temporary data according to the data values of the real data. The temporary data is the inverted real data when the number of real data values having a data value of A causing a current consumption of a is less than the number of real data values having a data value of B causing a current consumption of b that is more than the current amount a, and the non-inverted real data when the number of real data values having the data value of A is greater than the number of real data values having the data value of B.

According to method aspects of the present invention, there is provided a method of simultaneously outputting a plurality of data having a data value of A consuming a current amount of a, or B consuming a current amount of b which is more than the amount of a. This method comprises the steps of sensing the data values of a plurality of real data; comparing the number (m) of real data having the data value of A to the number (n) of real data having the data value of B; generating temporary data by inverting the real data when the number (m) is greater than the number (n), and by non-inverting the real data when the number (m) is less than the number (n); and generating an indication signal for indicating the correlation between the temporary data and the real data.

According to other method aspects of the present invention, there is provided a data input and output method having an input and output system having an input/output device for simultaneously inputting/outputting a plurality of data having a data value of A consuming a current amount of a, or B consuming a current amount of b which is more than the amount of a. This method preferably comprises the steps of detecting the data values of a plurality of real data; comparing the number (m) of real data having the data value of A to the number (n) of real data having the data value of B; generating temporary data by inverting the real data when the number (m) is less than the number (n), and by non-inverting the real data when the number (m) is greater than or equal to the number (n); generating a control signal for indicating the correlation between the temporary data and the real data; and generating predetermined input data whose correlation with the temporary data is determined in response to the control signal. The input data has the same data value as the real data.

According to the present invention, when the number of data values causing large consumption of current is more than the number of data values causing a small consumption of current, the values of output data are inverted and output. The amount of current consumed therefore may be reduced. The reduction of the amount of current consumed can provide an increase in the efficiency and/or the life of an integrated circuit using the present invention.

DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary conductive type embodiment as well.

Figure 1:
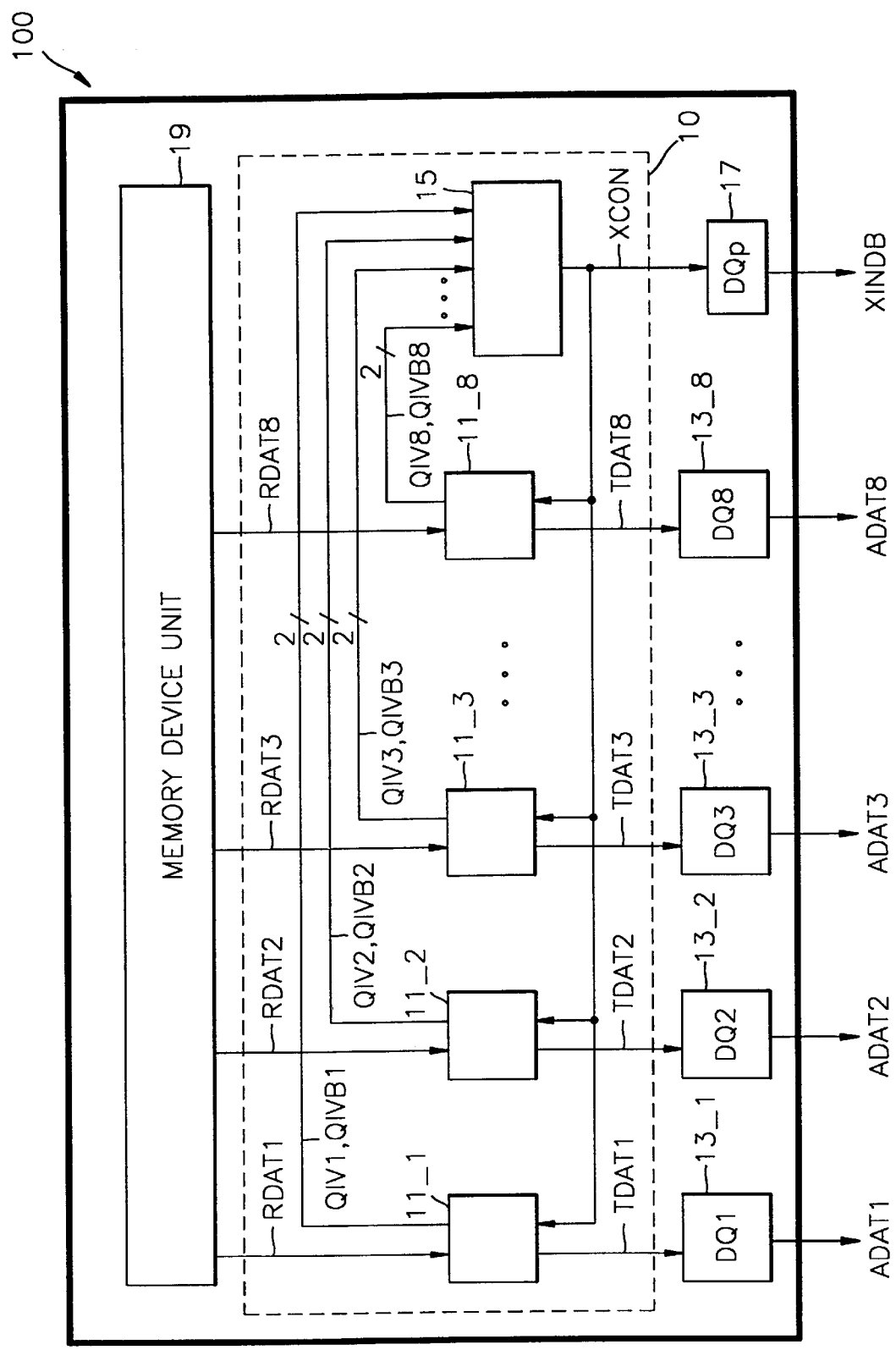
FIG. 1 is a block diagram illustrating an integrated circuit including a low current operation circuit according to an embodiment of the present invention.

FIG. 1 shows an output device 100 having a low current operation output circuit 10 according to an embodiment of the present invention. The output device 100 preferably corresponds to a portion of, or a complete, integrated circuit. The low current operation output circuit 10 simultaneously outputs a plurality of bits each having a logic value of either "0" or "1". For the sake of convenience, in this specification, a low current operation output circuit 10 that simultaneously outputs 8 bits of data is described as an example.

Data output units 11_i (where i=1 through 8) receive real data RADTi (where i=1 through 8) output from a memory device unit 19, and generate corresponding temporary data TDATi (where i=1 through 8). When the number of "1" data value is greater than the number of "0" data values in the real data (RADTi), RADTi is inverted to produce temporary data TDATi corresponding respectively to RADTi. When the number of "1" data values is less than the number of "0" data values in the real data (RADTi), TDATi is non-inverted data of RADTi.

A control unit 15 detects the magnitude relationship between the number of real data values RADTi having the data value of "1" and the number of real data values RADTi having the data value of "0", and generates a control signal XCON. The control signal XCON controls the data output units (11_i) and determines the temporary data TDATi and the real data RADTi.

Output pad units 13_i (where i=1 through 8) generate transmission data ADATi (where i=1 through 8) in response to the temporary data TDATi. The output pad units (13_i) have an open-drain structure. An output transistor of each of the output pad units (13_i) is assumed to be an NMOS transistor. Thus, the output pad units (13_i) consume much current when a data value of "1" is input, and consume very little current when a data value of "0" is input. An auxiliary output pad unit 17 receives the control signal XCON and externally provides an indication signal, also referred to as an indicator, XINDB.

Figure 2:
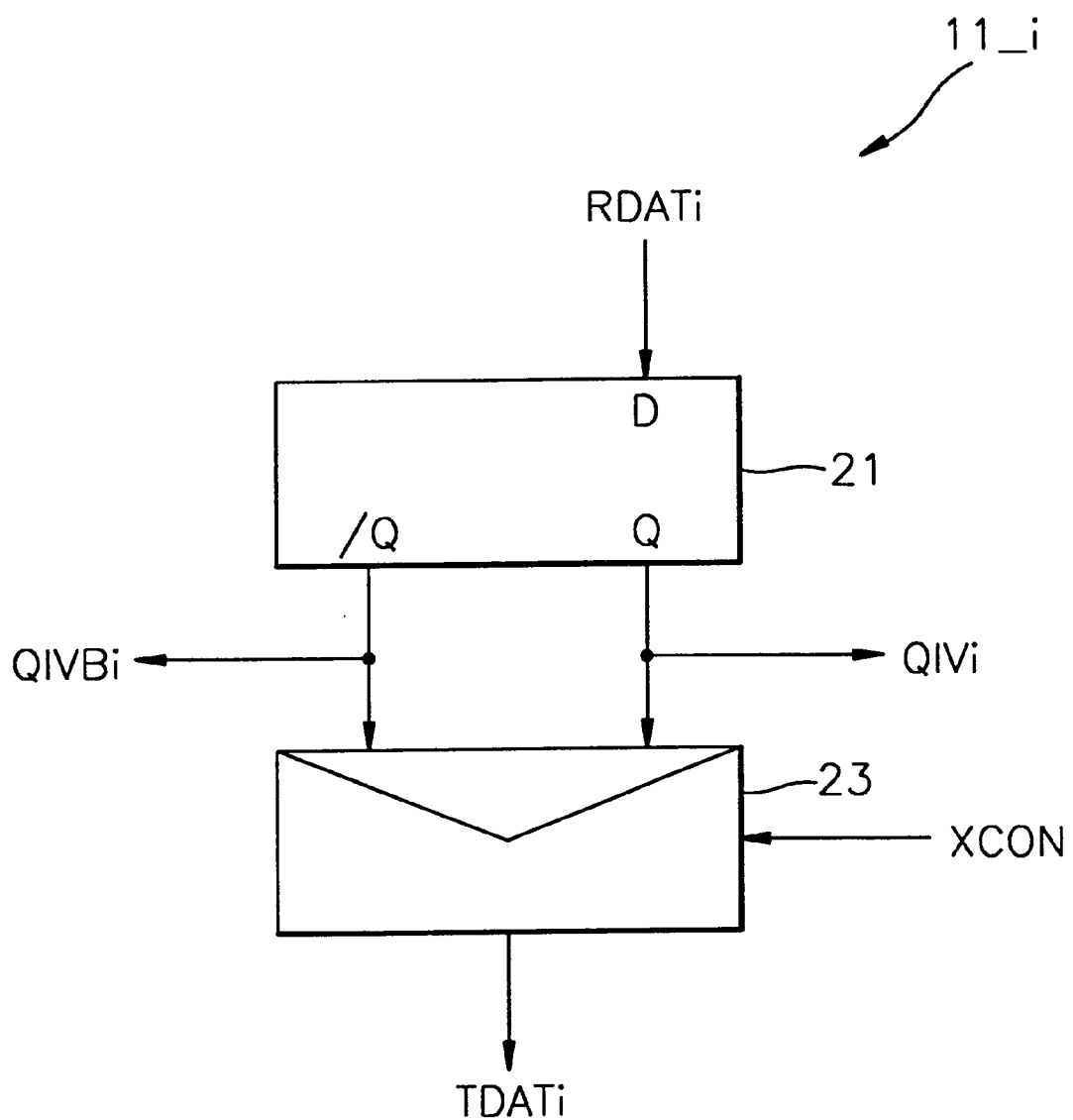
FIG. 2 is a block diagram illustrating a data output unit of FIG. 1.

FIG. 2 shows the data output unit 11_i of FIG. 1. To be more specific, the data output unit 11_i includes a dual output unit 21 and a selector 23.

The dual output unit 21 receives the real data RADTi and generates inverted data QIVBi (where i=1 through 8) and non-inverted data QIVi (where i=1 through 8) from the real data RADTi. Preferably, the dual output unit 21 is a D flip-flop.

The selector 23 receives the inverted data QIVBi (where i=1 through 8) and non-inverted data QIVi (where i=1 through 8) of the real data RADTi, and generates the temporary data TDATi in response to the control signal XCON. That is, when the control signal XCON is activated, the temporary data TDATi is the inverted data QIVBi of the real data RADTi. When the control signal XCON is deactivated, the temporary data TDATi is the non-inverted data QIVi of the real data RADTi. Preferably, the selector 23 is a 2:1 multiplexer.

Figure 3:
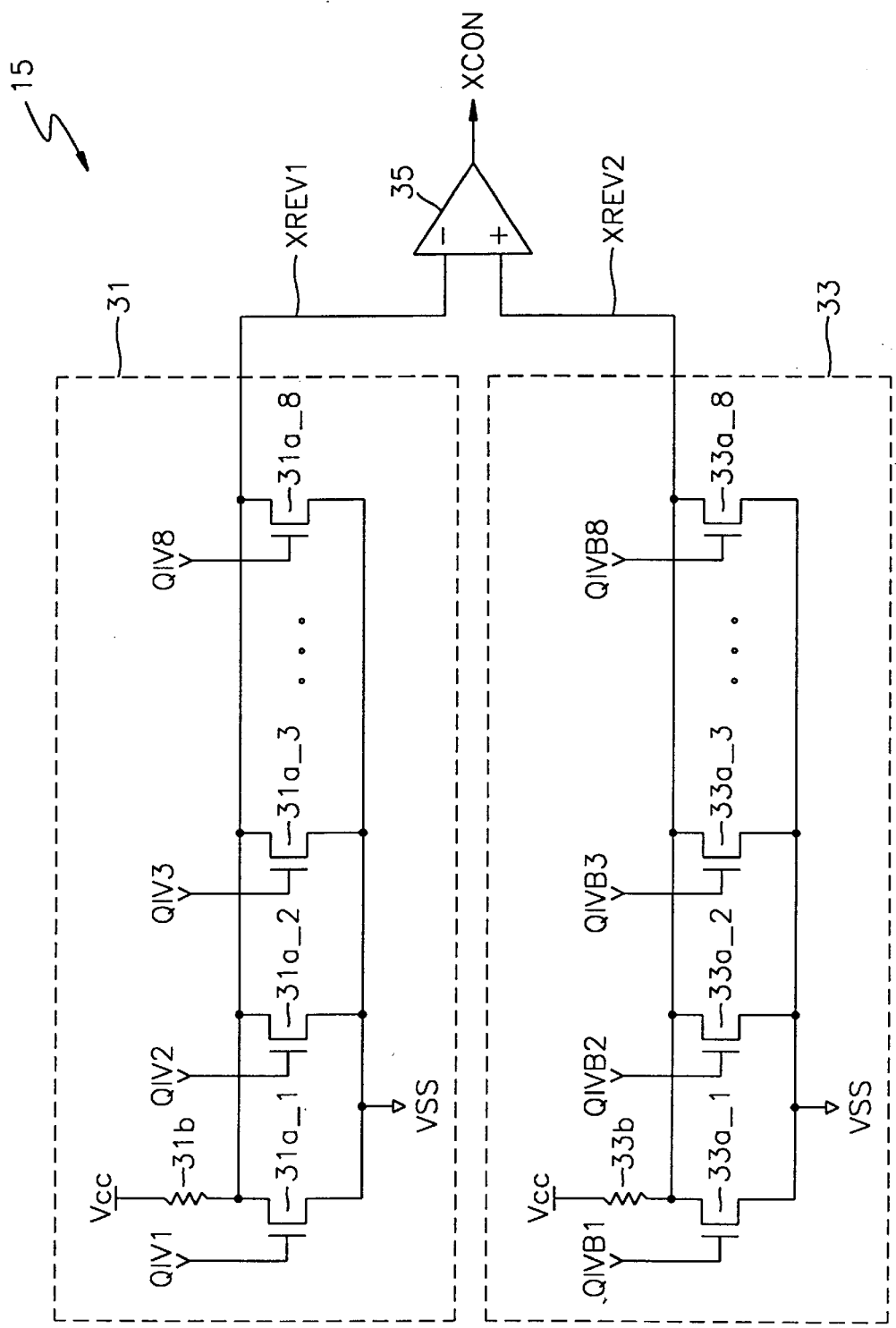
FIG. 3 is a circuit diagram illustrating a control unit of FIG. 1.

FIG. 3 shows the control unit 15 of FIG. 1. Referring to FIG. 3, the control unit 15 includes a non-inversion detecting unit 31, an inversion detecting unit 33, and a comparator 35.

The non-inversion detecting unit 31 detects the value of the non-inverted data QIVi of the real data RADTi, and generates a non-inversion detecting signal XREV1 whose voltage level drops according to the number of non-inverted data values QIVi having a data value of "1".

To be more specific, the non-inversion detecting unit 31 includes first NMOS transistors 31a_i (where i=1 through 8) and a first resistor 31b. Each of the first group of NMOS transistors 31a_i (where i=1 through 8) have a source port connected to the ground voltage VSS, and gate ports to which the non-inverted data values QIVi of the corresponding real data RADTi are applied. The first resistor 31b connects the drain port of the first NMOS transistor 31a_i to a power supply voltage VCC. The drain port of the first NMOS transistor 31a_i outputs the non-inversion detecting signal XREV1.

Accordingly, the voltage level of the non-inversion detecting signal XREV1 lowers in response to an increase in the number of non-inverted data values QIVi having a data value of "1". That is, as the number of real data values RADTi having a value of "1" increases, the voltage level decreases.

The inversion detecting unit 33 detects the value of the inverted data QIVBi of the real data RADTi. The inversion detecting unit 33 generates an inversion detecting signal XREV2 whose voltage level decreases according to the number of inverted data values QIVBi having a data value of "1".

To be more specific, the inversion detecting unit 33 includes second NMOS transistors 33a_i (where i=1 through 8) and a second resistor 33b. The second NMOS transistors 33a_i (where i=1 through 8) have a source port connected to the ground voltage VSS, and gate ports to which the inverted data QIVBi of the real data RADTi is applied. The second resistor 33b connects the drain port of the second NMOS transistor 33a_i to the power supply voltage VCC. The drain port of the second NMOS transistor outputs the inversion detecting signal XREV2.

Accordingly, the voltage level of the inversion detecting signal XREV2 decreases in response to an increase in the number of inverted data values QIVBi having a data value of "1". That is, as the number of real data values RADTi having a value of "0" increases, the voltage level decreases.

The comparator 35 compares the voltage level of the non-inversion detecting signal XREV1 to the voltage level of the inversion detecting signal XREV2, and generates the control signal XCON. To be more specific, the non-inversion detecting signal XREV1 is applied to an inversion input port (−) of the comparator 35, and the inversion detecting signal XREV2 is applied to a non-inversion input port (+) of the comparator 35.

The comparator 35 is designed to be deactivated when the voltages of the inversion and non-inversion input ports (−) and (+) are the same. Thus, when the voltage level of the non-inversion detecting signal XREV1 is lower than that of the inversion detecting signal XREV2, the control signal XCON is activated. That is, when the number of real data values RADTi having a data value of "0" is greater than the number of real data values RADTi having a data value of "1" the control signal XCON is activated to be "high". However, when the voltage level of the non-inversion detecting signal XREV1 is higher than or equal to that of the inversion detecting signal XREV2, the control signal XCON is deactivated. That is, when the number of real data RADTi having a data value of "0" is less than the number of real data RADTi having a data value of "1", the control signal XCON is deactivated to be "low". The control signal XCON also preferably is deactivated to "low" when the number of real data RADTi having a data value of "0" is equal to the number of real data RADTi having a data value of "1."

Figure 4:
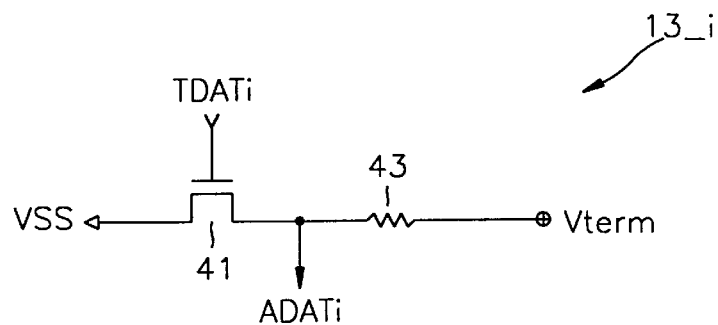
FIG. 4 is a circuit diagram illustrating an output pad unit of FIG. 1.

FIG. 4 shows the output pad unit 13_i of FIG. 1. Referring to FIG. 4, the output pad unit 13_i includes an output transistor 41 and a resistor 43 also referred to as an end resistor. The output transistor 41 is an NMOS transistor having a source port to which the ground voltage VSS is connected, and a gate port to which temporary data TDATi is applied. The end resistor 43 connects the terminal voltage Vterm to the drain port of the output transistor 41. The drain port of the output transistor 41 outputs the transmission data ADATi.

Thus, when the temporary data TDATi is "1", the output pad unit 13_i consumes a great amount (about 50 mA) of current. However, when the temporary data TDATi is "0", the output pad unit 13_i consumes little or no current.

Tables 1 and 2 show the data values of the temporary data TDATi and control signal XCON when the number of real data RADTi having a data value of "1" is greater than that of real data RADTi having a data value of "0".

TABLE 1

| | 1 | 2 | 3 | 4 | 5 | 6 | 7 | 8 | XCON |
|---|---|---|---|---|---|---|---|---|---|
| RDATi | 1 | 1 | 1 | 1 | 1 | 1 | 1 | 1 | X |
| TDATi | 0 | 0 | 0 | 0 | 0 | 0 | 0 | 0 | 1 |

Table 1 shows the case that all the data values of the real data RADTi are "1". Here, the data value of the control signal XCON is "1", so the temporary data TDATi is the inverted data of the real data RADTi. X indicates that no control signal XCON exists when the low current operation output circuit of the present invention is not used.

If the real data RADTi is non-inverted and output, the amount of consumed current is about 400 mA (=50 mA per bit) which is consumed by the output pad units 13_i. However, when the temporary data TDATi obtained by inverting the real data RADTi is output, the amount of consumed current is only about 50 mA which is consumed by the output of the control signal XCON. Thus, about 350 mA of current consumption can be saved by the low current operation output circuit 10 of the present invention.

TABLE 2

| | 1 | 2 | 3 | 4 | 5 | 6 | 7 | 8 | XCON |
|---|---|---|---|---|---|---|---|---|---|
| RDATi | 1 | 1 | 0 | 0 | 0 | 1 | 1 | 1 | x |
| TDATi | 0 | 0 | 1 | 1 | 1 | 0 | 0 | 0 | 1 |

Table 2 shows the case that there are 5 real data RADTi having the data value of "1" and 3 real data RADTi having the data value of "0". Here, the data value of the control signal XCON is "1", so the temporary data TDATi is the inverted data of the real data RADTi.

If the real data RADTi is non-inverted and output, the amount of consumed current is about 250 mA (=50 mA per bit) which is consumed by five of the output pad units 13_i. However, when the temporary data TDATi is output by inverting the real data RADTi, the amount of consumed current is about 150 mA (=50 mA per bit) which is consumed by the three output pad units 13_i and about 50 mA which is consumed by the output of the control signal XCON. Thus, the total amount of consumed current is about 200 mA, so about 50 mA of current consumption may be saved by the low current operation output circuit 10 of the present invention.

Table 3 shows the data values of the temporary data TDATi and control signal XCON when the number of real data RADTi having a data value of "1" is equal to that of real data RADTi having a data value of "0".

TABLE 3

| | i | | | | | | | |
|---|---|---|---|---|---|---|---|---|
| | 1 | 2 | 3 | 4 | 5 | 6 | 7 | 8 |
| RDATi | 1 | 0 | 0 | 1 | 0 | 0 | 1 | 1 | X |
| TDATi | 1 | 0 | 0 | 1 | 0 | 0 | 1 | 1 | 0 |

Table 3 shows the case that there are 4 real data RADTi having the data value of "1" and 4 real data RADTi having the data value of "0". Here, the data value of the control signal XCON preferably is "0", so the temporary data TDATi is the non-inverted data of the real data RADTi.

If the real data RADTi is non-inverted and output, the amount of consumed current is about 200 mA (=50 mA per bit) which is consumed by the four output pad units 13_i. However, when the temporary data TDATi is output by inverting the real data RADTi, the amount of consumed current is about 200 mA (=50 mA per bit) which is consumed by the four output pad units 13_i and about 50 mA which is consumed by the output of the control signal XCON. Thus, the total amount of consumed current is about 250 mA, so about 50 mA of current consumption is added when the temporary data TDATi is output by inverting the real data RADTi. Therefore, when the number of real data RADTi having the data value of "1" is equal to that of real data RADTi having the data value of "0", the temporary data TDATi preferably is the non-inverted data of the real data RADTi. Thus, the current consumption can be reduced by about 25% by the low current operation output circuit 10 of the present invention.

Figure 5:
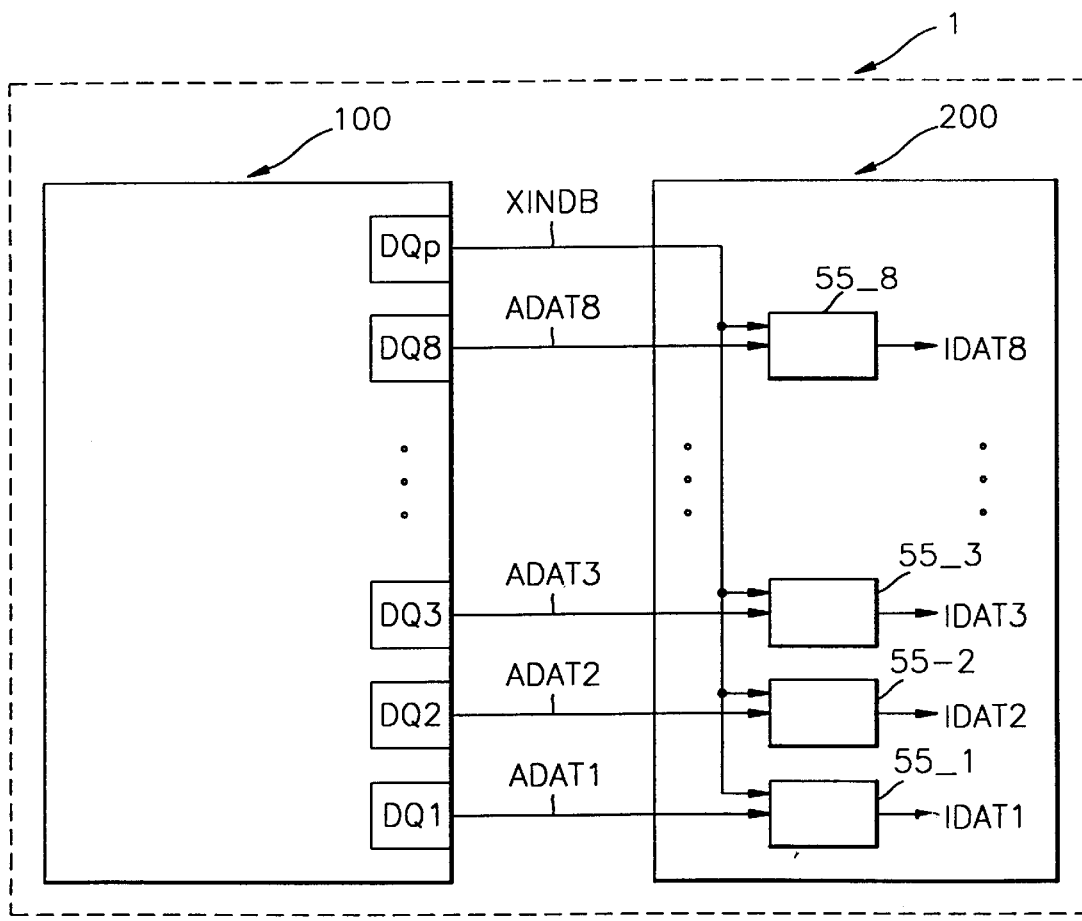
FIG. 5 is a block diagram illustrating an embodiment of a low current operation input-output system using a low current operation output circuit according to the present invention.

FIG. 5 shows an example of a low current operation system according to the present invention. Referring to FIG. 5, a low current operation system 1 includes an output device 100 and an input device 200. It will be understood that devices 100 and 200 may be separate integrated circuits or may be integrated into a single integrated circuit.

The output device 100 is as shown in FIG. 1. That is, the output device 100 inverts the real data RADTi and outputs the transmission data ADATi when the number of real data RADTi (not shown in FIG. 5) having the data value of "1" is greater than the number of real data RADTi having the data value of "0". The output device 100 does not invert the real data RADTi and outputs the transmission data ADATi when the number of real data RADTi having the data value of "1" is less than or equal to the number of real data RADTi having the data value of "0". A detailed embodiment of the output device 100 is as shown in FIG. 1 and need not be described in detail again.

The input device 200 will now be described in detail. The input device 200 receives the transmission data ADATi and the indication signal XINDB and generates input data IDATi (where i=1–8). The indication signal XINDB has an inverted state of the control signal XCON (refer to FIG. 1). That is, the input data IDATi is the inverted data of the transmission data ADATi when the indication signal XINDB is activated. The input data IDATi is the non-inverted data of the transmission data ADATi when the indication signal XINDB is deactivated. Accordingly, the input data values IDATi have the same data values as the real data RADTi.

The input device 200 includes a plurality of data input circuits 55_i (where i=1–8). The data input circuits 55_i receive the transmission data ADATi corresponding to the respective data input circuits 55_i and generate the input data IDATi under the control of the indication signal XINDB.

Figure 6:
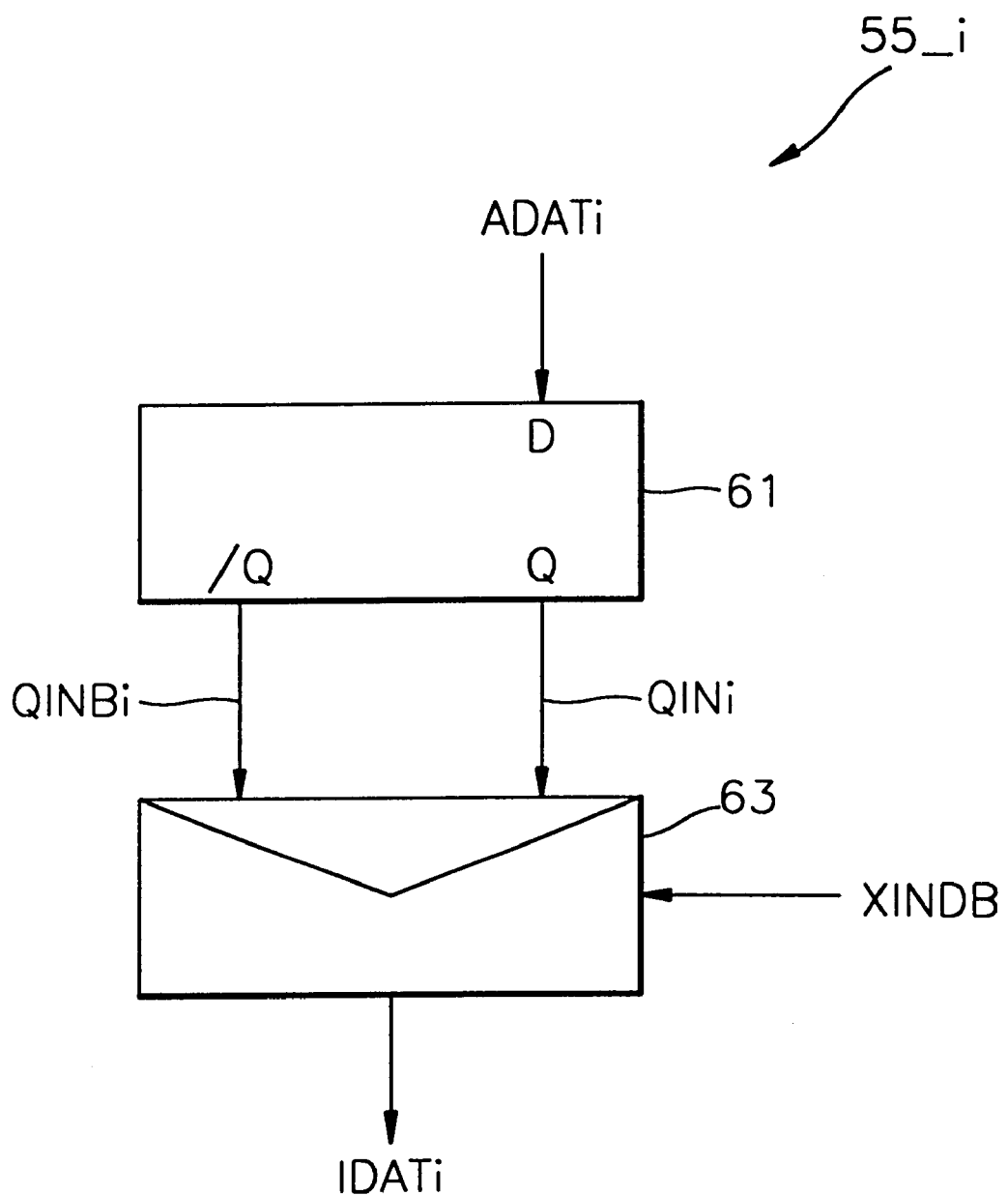
FIG. 6 is a block diagram illustrating the data input circuit of FIG. 5.

FIG. 6 shows a data input circuit 55_i of FIG. 5. Referring to FIG. 6, the data input circuit 55_i includes a dual output unit 61 and a selector 63. The dual output unit 61 receives the transmission data ADATi and generates the inverted data QINBi and non-inverted data QINi of the transmission data ADATi.

The selector 63 receives the inverted data QINBi and non-inverted data QINi of the transmission data ADATi, and generates the input data IDATi in response to the indication signal XINDB. That is, the input data IDATi when the indication signal XINDB is activated has the same data value as the inverted data QINBi of the transmission data ADATi. The input data IDATi when the indication signal XINDB is deactivated has the same data value as the non-inverted data QINi of the transmission data ADATi. Thus, the input data IDATi has the same data value as the real data RADTi.

The present invention was described with reference to the embodiment shown in the drawings, but the embodiment is just an example. It will be understood by those skilled in the art that various modifications and other embodiments may be effected. For example, the output transistor of the output pad unit 13_i is described as an NMOS transistor, but can be a PMOS transistor. For a PMOS transistor, the source port of the output transistor is connected to the power supply voltage, and the drain port thereof is connected to the terminal voltage via the end resistor. When the output transistor is the PMOS transistor, much current is consumed when a data value of "0" is output. Thus, in this case, it is apparent to those skilled in the art that when the number of real data RADTi having a data value of "0" is greater than the number of real data RADTi having a data value of "1", the output transistor may be designed to be activated. Finally, it was described that the low current operation output device in the present specification simultaneously outputs 8 bits of data, but it is also apparent that the number of data output simultaneously can be increased or decreased.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An output circuit for simultaneously outputting a plurality of data values A causing a current consumption of a, or B causing a current consumption of b which is more than the amount a, the circuit comprising:

a plurality of data output units that detect a plurality of real data values and that generate temporary data corresponding to the respective real data in response to a control signal; and a control unit that generates the control signal which is activated according to the magnitude relation between the number of real data values A and the number of real data values B;

wherein the temporary data is the inverted real data when the number of real data values A is less than the number of real data values B, and the non-inverted real data when the number of real data values A is greater than the number of real data values B; and wherein the control unit comprises:
- a non-inversion detecting unit that detects the non-inverted data values of the real data and that generates a non-inversion detecting signal driven by the non-inverted data having the data values of B;
- an inversion detecting unit that detects the inverted data values of the real data and that generates an inversion detecting signal driven by the inverted data having the data values of A; and
- a comparator that compares the voltage level of the non-inversion detecting signal to the voltage level of the inversion detecting signal, and that generates the control signal.

2. The output circuit as claimed in claim 1, wherein the control signal is deactivated when the number of real data having the data values of A is equal to the number of real data having the data values of B.

3. The output circuit as claimed in claim 2, wherein the non-inversion detecting unit comprises:
- first NMOS transistors, the source ports of which are each connected to a ground voltage, and which are gated by the non-inverted data of the corresponding real data; and
- first resistors that connect the drain ports of the first NMOS transistors to a power supply voltage, and wherein the inversion detecting unit comprises:
- second NMOS transistors the source ports of which are each connected to the ground voltage and which are gated by the inverted data of the corresponding real data; and
- second resistors that connect the drain ports of the second NMOS transistors to the power supply voltage.

4. The output circuit as claimed in claim 2, wherein each of the data output units comprises:
- a dual output unit that receives the real data and that generates the inverted and non-inverted real data; and
- a selector that receives the inverted and non-inverted real data and that generates the temporary data.

5. The output circuit as claimed in claim 4, wherein the dual output unit is a D-type flip-flop.

6. The output circuit as claimed in claim 4, wherein the selector outputs the inverted real data in response to activation of the control signal, and the non-inverted real data in response to deactivation of the control signal.

* * * * *